(12) United States Patent
Zeng et al.

(10) Patent No.: US 11,815,931 B2
(45) Date of Patent: Nov. 14, 2023

(54) JOYSTICK DEVICE AND HANDLE

(71) Applicant: GUANGDONG K-SILVER INDUSTRIAL CO., LTD., Shenzhen (CN)

(72) Inventors: Xiao Zeng, Shenzhen (CN); Jianbo Zhao, Shenzhen (CN)

(73) Assignee: GUANGDONG K-SILVER INDUSTRIAL CO., LTD., Shenzhen (CN)

( * ) Notice: Subject to any disclaimer, the term of this patent is extended or adjusted under 35 U.S.C. 154(b) by 0 days.

(21) Appl. No.: 17/561,763

(22) Filed: Dec. 24, 2021

(65) Prior Publication Data

US 2023/0084417 A1 Mar. 16, 2023

(30) Foreign Application Priority Data

Sep. 10, 2021 (CN) .......................... 202111062644.X

(51) Int. Cl.
| | |
|---|---|
| *G05G 9/047* | (2006.01) |
| *A63F 13/24* | (2014.01) |
| *G01D 5/14* | (2006.01) |
| *H05K 1/18* | (2006.01) |
| *H01H 13/14* | (2006.01) |

(52) U.S. Cl.
CPC ............ *G05G 9/047* (2013.01); *A63F 13/24* (2014.09); *G01D 5/145* (2013.01); *H05K 1/189* (2013.01); *G05G 2009/04711* (2013.01); *G05G 2009/04744* (2013.01); *G05G 2009/04751* (2013.01); *G05G 2009/04755* (2013.01); *H01H 13/14* (2013.01); *H01H 2221/012* (2013.01); *H05K 2201/09063* (2013.01); *H05K 2201/09072* (2013.01); *H05K 2201/10053* (2013.01); *H05K 2201/10151* (2013.01); *H05K 2201/10265* (2013.01)

(58) Field of Classification Search
CPC ............................... A63F 13/24; G05G 9/047
USPC ..................................................... 74/471 XY
See application file for complete search history.

(56) References Cited

U.S. PATENT DOCUMENTS

2021/0247795 A1* 8/2021 Asano ...................... G05G 5/05

\* cited by examiner

*Primary Examiner* — Randell J Krug

(57) ABSTRACT

A joystick device is provided. The joystick device includes a housing, a joystick assembly, a reset assembly, a translation assembly, and a circuit board. A magnetic component is located on the translation assembly, and a magnetic induction element is located on the circuit board. The joystick assembly pushes the translation assembly to translate, and the magnetic induction element generate an output that changes with the movement of the translation assembly. A handle using the joystick device also provided.

13 Claims, 5 Drawing Sheets

JOYSTICK DEVICE AND HANDLE

CROSS REFERENCE TO RELATED APPLICATION

This non-provisional patent application claims priority under 35 U.S.C. § 119 from Chinese Patent Application No. 202111062644.X filed on Sep. 10, 2021, the entire content of which is incorporated herein by reference.

TECHNICAL FIELD

The disclosure relates to game controller technology, in particular to a joystick device and a handle using the joystick device.

BACKGROUND

Joystick device is one of common input devices, that is, the so-called 3D joystick, which is mainly used in electronic products such as game controllers. The joystick device mainly includes a stick and two rotating arms (an upper rotating arm and a lower rotating arm). The stick is stirred to drives the two rotating arm to operate a potentiometer regulator module to output a specific resistance value.

The typical joystick device commonly includes a brush, a circuit board, and a carbon film set on the circuit board. The brushes moves on the carbon film under an external force to generate different resistance values by the circuit board, and then different electronic signals are generated according to the different resistance values. The electric signals are capable of controlling the joystick device to control different directions. However, the method of adjusting the joystick device by a contact between the brush and the carbon film generally has the following disadvantages: if the metal with greater elasticity is used as the brush, the brush wears out quickly and the service life is short. If the metal with less elasticity is used as the electric brush, when brushing, a problem of poor contact and failure between the brush and the carbon film will easily occur; otherwise, if a high-hardness carbon film is used, the brush wears out quickly and will produce greater electrical noise, otherwise, if a low-hardness carbon film is used, the surface layer of the carbon film will soon be rubbed out of the carbon powder by the electric brush, and the carbon powder will stick to the electric brush, which affects the electrical performance of the electric brush and causes the joystick device to malfunction. Therefore, such joystick devices generally have short service life and poor performance defects, which eventually lead to the problem of "drift" during the game by gamers.

SUMMARY

In order to solve the above problems, a joystick device and a handle, which adopts Hall effect design, has the advantages of high control accuracy, stable output signal, long service life, etc., and can completely solve the "drift" of game players during the game problem.

In a first respect, a joystick device is provided and the joystick device includes a housing, a joystick assembly, a reset assembly, a translation assembly and a circuit board the joystick assembly, the reset assembly, the translation assembly and the circuit board are located in housing. The joystick assembly is capable of swinging in a first direction and a second direction perpendicular to each other; the reset assembly is configured to reset the joystick assembly after the joystick assembly swings; the translation assembly translates to left-right or forward-backward according to swing of the joystick assembly in the first direction or swing of the joystick assembly in the second direction respectively, a magnetic element is fixed on the translation assembly. A magnetic induction element is fixed on the circuit board, the magnetic induction element generates an output that changes with the movement of the translation assembly.

In a first respect, a handle is provided and the handle includes the joystick assembly described above.

In this disclosure, the swing of the joystick assembly in the first direction and the second direction is converted into the movement of left-right translation and forward-backward translation through the translation assembly. Since the magnetic element is fixed on the translation assembly, the magnetic induction element is fixed on the circuit board to generate two electrical signal outputs by detecting the translation amount of the movement in the same plane in the two directions. The structure with translational displacement can achieve higher accuracy, so the joystick device has the advantages of high control accuracy, high sensitivity, stable output signal, long service life, etc. In addition, there is no frictional contact between the translation assembly and the magnetic induction element, which improves the service life and can completely solve the problem of "drift" during the game of game players.

DETAILED DESCRIPTION OF THE EMBODIMENTS

Figure 1:
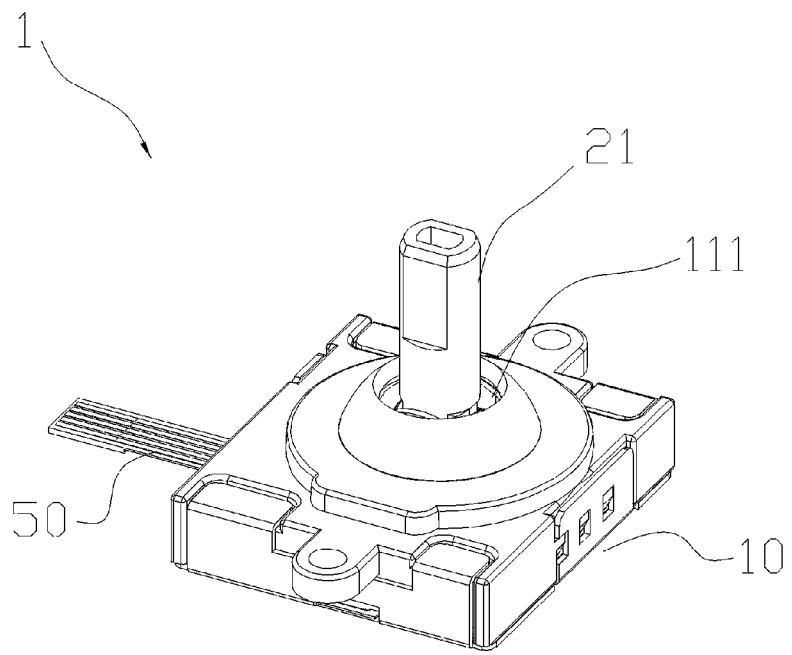
FIG. 1 illustrates a schematic diagram of the structure of the joystick device in accordance with a first embodiment.

The technical solution of the present invention will be clearly and completely described below in conjunction with the accompanying drawings. Obviously, the described embodiments are part of the embodiments of the present invention, rather than all of the embodiments. Based on the embodiments of the present invention, all other embodiments obtained by those of ordinary skill in the art without creative work shall fall within the protection scope of the present invention.

In the description of the present invention, it should be noted that the terms "center", "upper", "lower", "left", "right", "vertical", "horizontal", "inner", "outer", etc. The indicated orientation or positional relationship is based on the orientation or positional relationship shown in the drawings, and is only for the convenience of describing the present invention and simplifying the description, and does not indicate or imply that the pointed device or element must have a specific orientation or a specific orientation. The structure and operation cannot therefore be understood as a limitation of the present invention. In addition, the terms "first", "second", and "third" are only used for descriptive purposes, and cannot be understood as indicating or implying relative importance.

In the description of the present invention, it should be noted that, unless otherwise clearly specified and limited, the terms "installation", "connection" and "connection" should be understood in a broad sense, for example, it can be a fixed connection or a detachable connection, connected or integrally connected; it can be a mechanical connection or an electrical connection; it can be directly connected or indirectly connected through an intermediate medium, and it can be the internal communication between two components. For those of ordinary skill in the art, the specific meaning of the above-mentioned terms in the present invention can be understood in specific situations.

Referring to FIGS. 1-7, a joystick device in accordance with a first embodiment is shown.

In this embodiment, a joystick device 1 includes a housing 10, and a joystick assembly 20, a reset assembly 30, a translation assembly 40, and a circuit board 50. The joystick assembly 20, the reset assembly 30, the translation assembly 40, and the circuit board 50 are mounted in the housing 10. The joystick assembly 20 is configured to swing in a first direction and a second direction perpendicular to each other. The reset assembly 30 is configured to reset the joystick assembly 20 after swinging. The translation assembly 40 is configured to translating to left and right or back and forth according to the swinging of the joystick assembly 20 in the first direction and the second direction respectively. A magnetic component 60 is located in the translation assembly 40, and a magnetic induction element 70 is located in the circuit board 50, and the magnetic induction element 70 generates an output that changes with the movement of the translation assembly 40.

In this embodiment, the magnetic element 60 is a magnet, the magnetic induction element 70 is a linear Hall element, and the circuit board 50 is a flexible circuit board.

Figure 2:
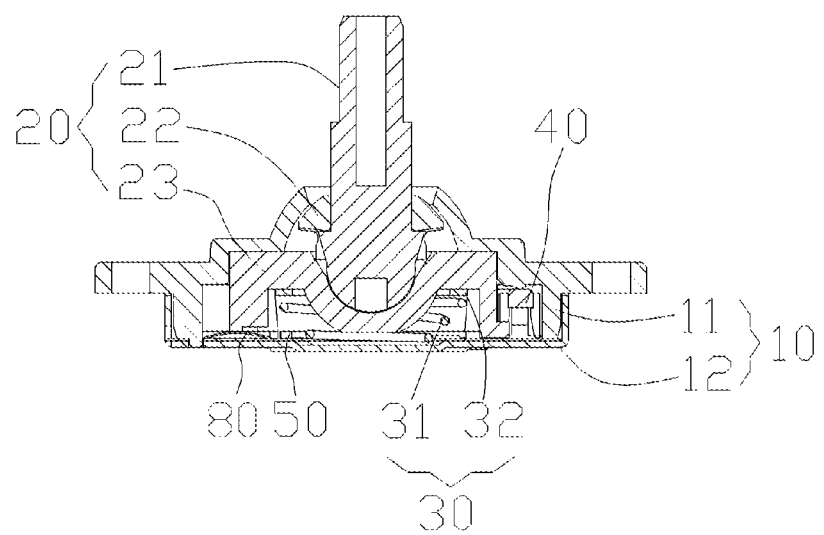
FIG. 2 illustrates a schematic cross-sectional view of the joystick device shown in FIG. 1 taken along a center line of the rotating stick.
Figure 3:
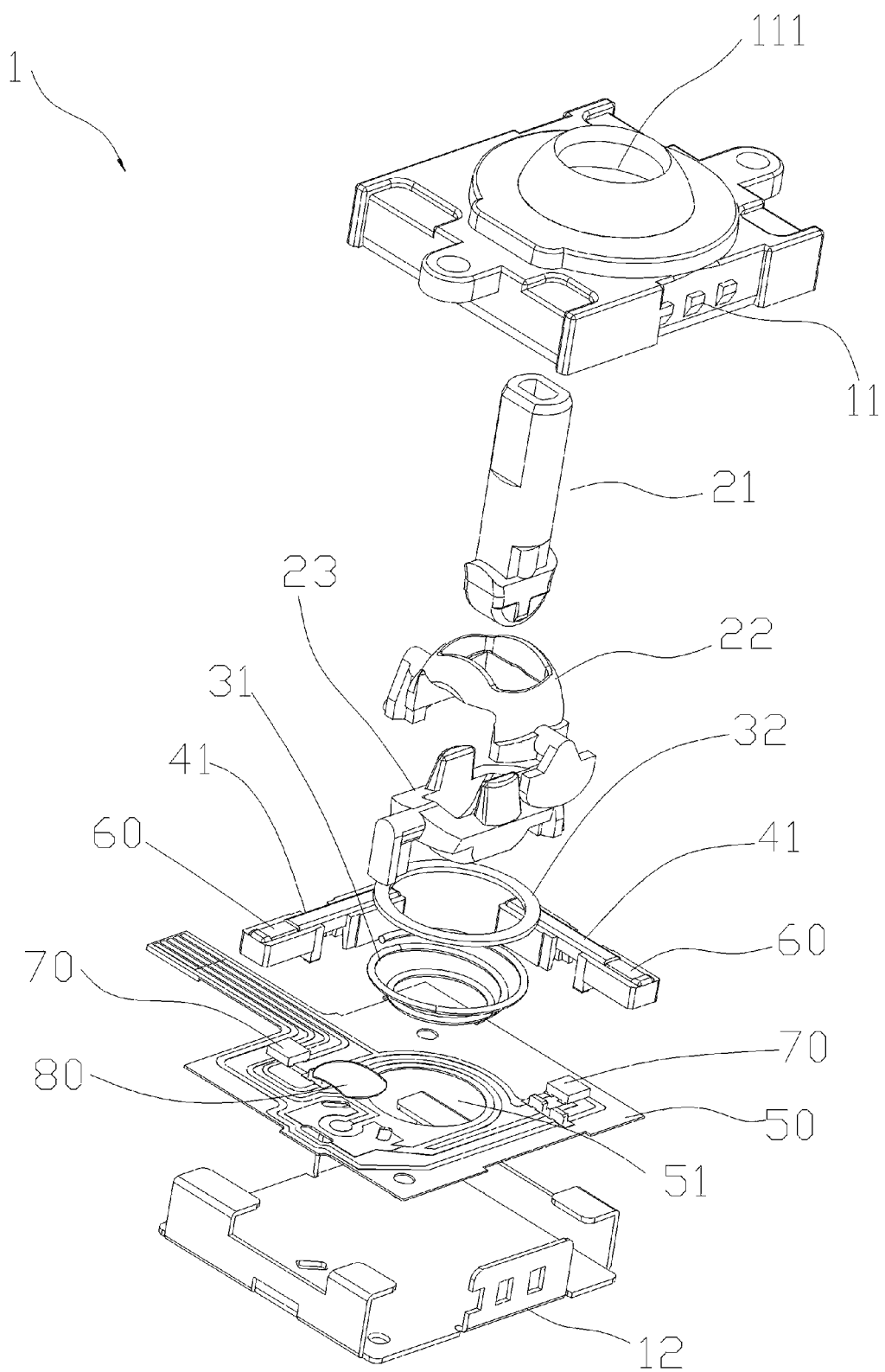
FIG. 3 illustrates an exploded schematic diagram of the joystick device in accordance with a first embodiment.
Figure 4:
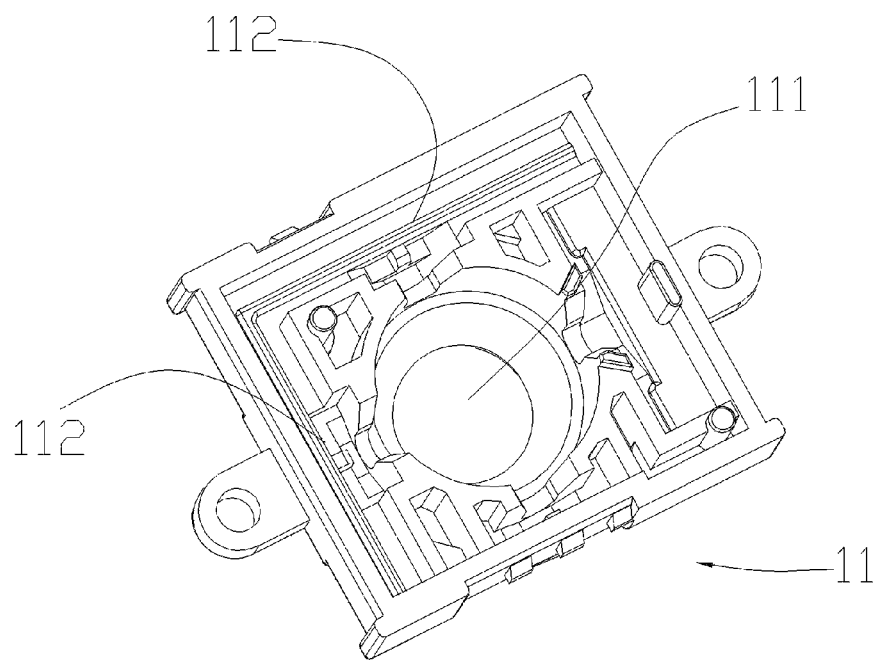
FIG. 4 illustrates a schematic diagram of a base of the joystick device in accordance with a first embodiment.

Referring to FIGS. 2 to 4, the housing 10 includes a base 11 and a bottom cover 12. The upper surface of the base 11 defines an opening 111, and the base 11 is engaged with the bottom cover 12 to form a central cavity. The joystick assembly 20, the reset assembly 30, the translation assembly 40 and the circuit board 50 are installed in the central cavity. The joystick assembly 20 includes a rotating stick 21, an upper rotating arm 22, and a lower rotating arm 23. The upper rotating arm 22 and the lower rotating arm 23 are arranged orthogonally to each other. A lower end of the rotating stick 21 is connected to the lower rotating arm 23, and an upper end of the rotating stick 21 protrudes out of the base 11 from the opening 111.

When a force is applied to the rotating stick 21 by operating the upper end of the rotating stick 21, the rotating stick 21 pushes the upper rotating arm 22 to swing in the first direction, and the rotating stick 21 pushes the lower rotating arm 23 to swing in the second direction.

The reset assembly 30 includes a spring 31 and a gasket 32. The spring 31 is a tower-shaped structure with a narrow bottom and a wide top. A center position of the circuit board 50 defines an embedded hole 51, a lower end of the spring 31 is embedded in the embedded hole 51, and an upper end of the spring 31 abuts against the lower rotating arm 23. The gasket 32 is arranged between the spring 31 and the lower rotating arm 23. After the force applied to the rotating stick is released, the joystick assembly 20 is reset by assembly 30 under the gasket 32 and the spring 31.

Figure 5:
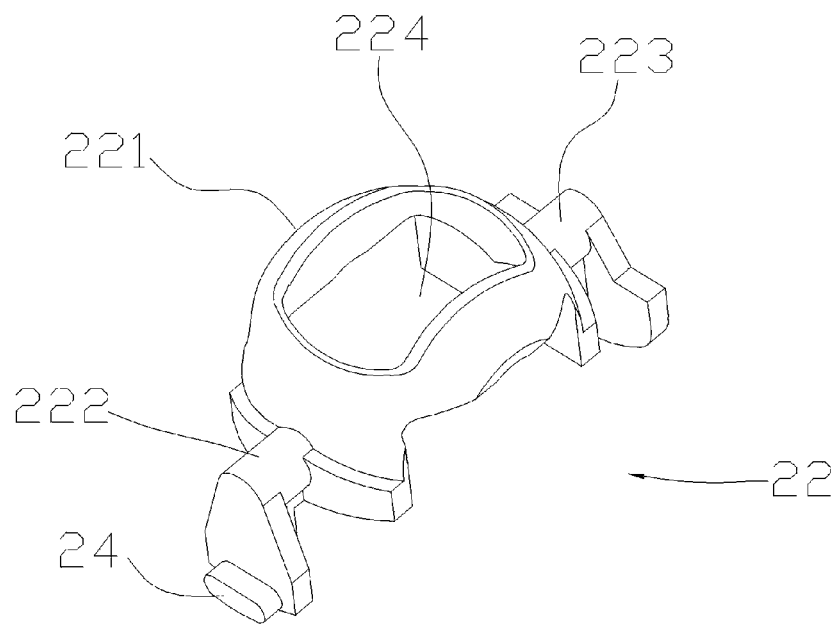
FIG. 5 illustrates a schematic diagram of an upper rotating arm of the joystick device in accordance with a first embodiment.

Referring to FIG. 5, the upper rotating arm 22 is in an arched shaped. A first protrusion 221 protrudes upwardly from a center position of the upper rotating arm 22. A first shaft end 222 and a first shaft end 223 are located on both sides of the first protrusion 221. A center position of the first protrusion 221 defines a through hole 224.

Figure 6:
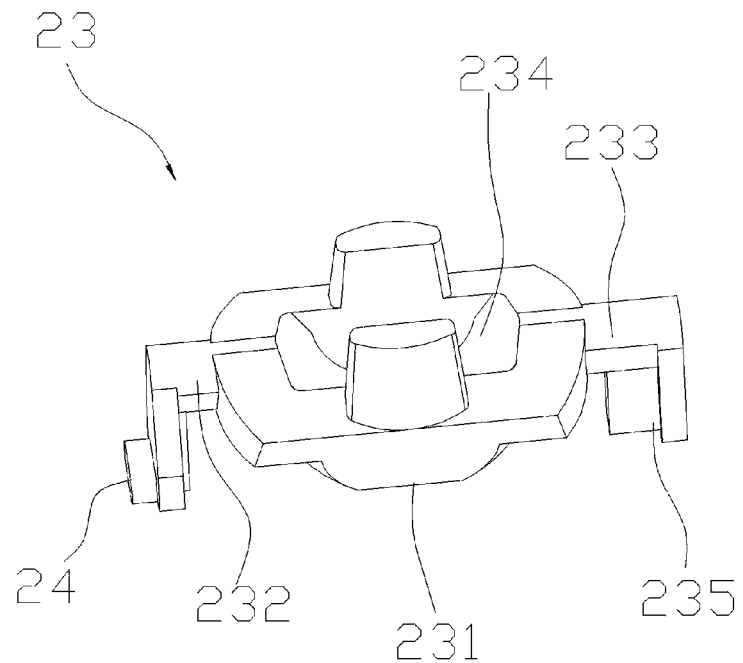
FIG. 6 illustrates a schematic structure of the lower rotating arm of the joystick device in accordance with a first embodiment.

Referring to FIG. 6, a second protrusion 231 protrudes downward from a center position of the lower rotating arm 23, a third shaft end 232 and a fourth shaft end 233 are located on both sides of the second protrusion 231. A concave 234 is defined in a center position of the upper surface of the protrusion 231. After passing through the through hole 224 of the upper rotating arm 22, the lower end of the rotating stick 21 is engaged to the concave 234 of the lower rotating arm 23. An lower end of the rotating stick 21 is passed through the through hole 224 of the upper rotating arm 22 and then engaged with the concave 234 of the lower rotating arm 23.

A snap dome 80 is located on the circuit board 50, and is configured to be a a switch button. A pressing block 235 extends downward from the fourth shaft end 233, and is hung above the snap dome 80.

The translation assembly 40 includes two sets of sliding members 41, and each set of sliding members 41 is equipped with a magnetic member 60; the base 11 has two sliding grooves 112 inside, and the sliding members 41 are installed in the sliding grooves 112 correspondingly. The sliding member 41 can slide in the sliding groove 112. The first shaft end 222 of the upper rotating arm 22 and the third shaft end 232 of the lower rotating arm 23 are both equipped with a pushing structure 24, and the pushing structure 24 pushes the sliding member 41 to translate.

Figure 7:
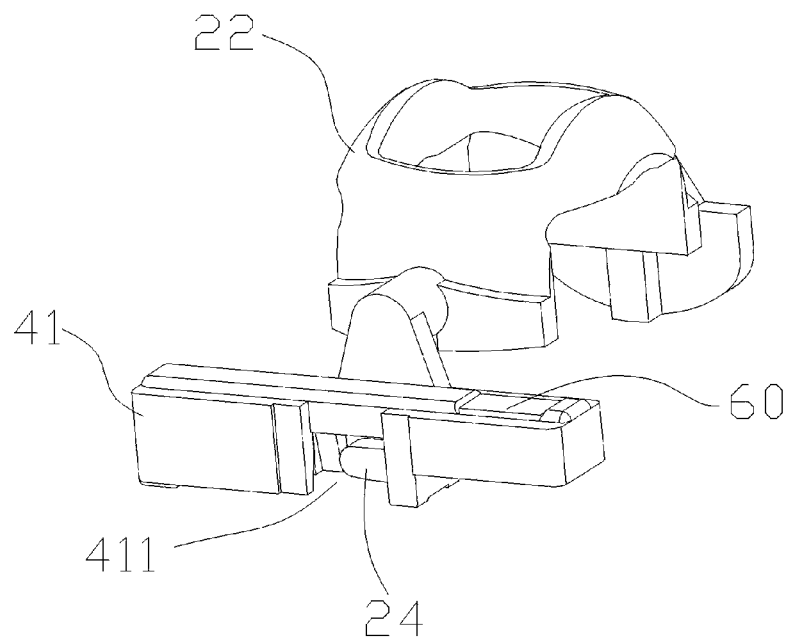
FIG. 7 illustrates a schematic diagram of a connection structure between the upper rotating arm and the sliding member of the joystick device in accordance with a first embodiment.

A connection relationship between the upper rotating arm 22 and the sliding member 41 is the same as a connection relationship between the lower rotating arm 23 and the sliding member 41. The connection relationship between the rotating stick 22 and the sliding member 41 is taken as an example. As shown in FIG. 7, the pushing structure 24 is a clamping block, the sliding member 41 defines a clamping slot 411, and the clamping block is clamped in the clamping slot 411. When the rotating stick 21 pushes the upper rotating arm 22 or the lower rotating arm 23 to swing, the sliding member 41 is translated.

There will be different structure of the sliding member from that of the sliding member 41 described above. In this disclosure will show the joystick device in accordance with a second embodiment and a third embodiment respectively with sliding members 41a and 41b having different structures from each other and the sliding members 41. In this embodiment, only the connection structure of the rotating stick and the sliding member are changed due to the structure of the sliding member have been changed, but the other structures of the joystick device in the different embodiments are not changed. Therefore, the connection structure of the rotating stick and the sliding member will be described in second and the third embodiments, and the other structure of the joystick device will not be described in detail here again.

Figure 8:
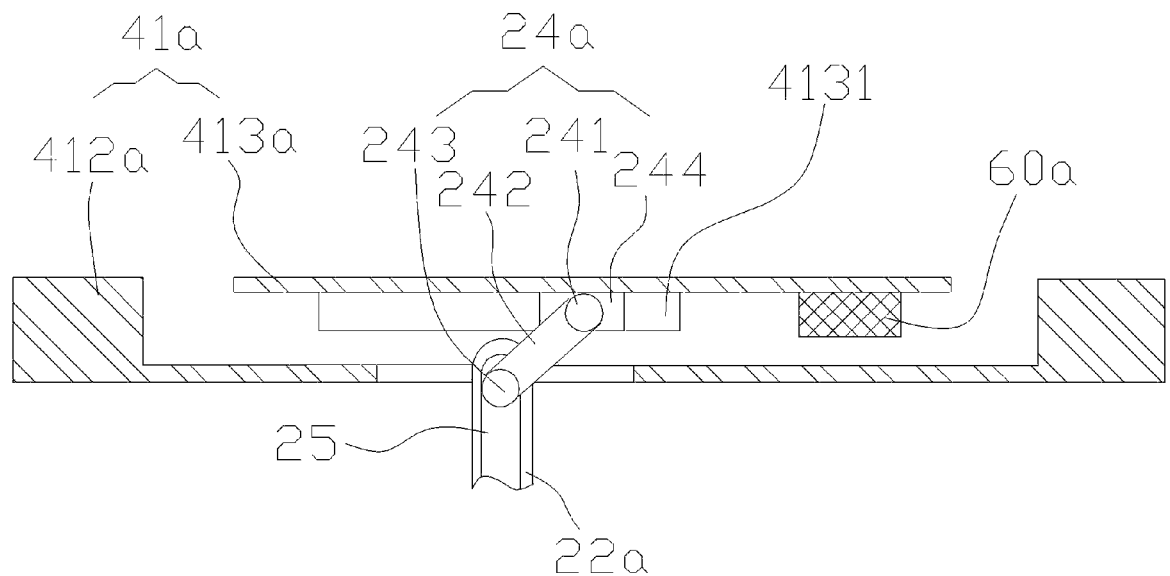
FIG. 8 illustrates a schematic diagram of the connection structure between the upper rotating arm and the sliding member of the second embodiment.

Referring to FIG. 8, the connection structure of the upper rotating arm and the sliding member of the present invention is shown in accordance with the second embodiment.

In this embodiment, the sliding member 41a includes a fixing member 412a and a movable member 413a. The magnetic member 60a is installed on the movable member 413a. The pushing structure 24a includes a rotating shaft 241, a connecting rod 242, a sliding rod 243, and a sliding block 244. The movable portion 413a defines a sliding channel 4131, and the sliding block 244 is installed in the sliding channel 4131. One end of the connecting rod 242 is connected to the sliding block 244 through the rotating shaft 241, and the other end is connected to the sliding rod 243. The upper rotating arm 22a defines a guide groove 25, and the sliding rod 243 is installed in the guide groove 25. When the rotating stick 21 pushes the upper rotating arm 22a to swing, the slide bar 243 moves in the guide groove 25, and the sliding block 244 is driven to translate left and right in the slide groove 4131 via the connecting rod 242, and the movable member 413a connected with the slide 244 is driven to translate left and right and the magnetic member 60a translates synchronously with the movable member 413a.

Figure 9:
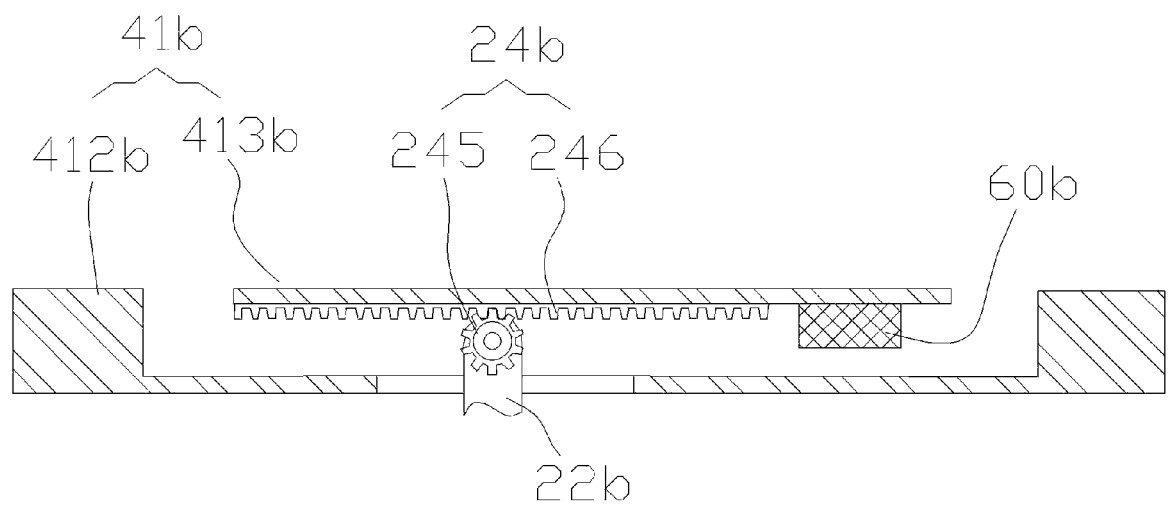
FIG. 9 illustrates a schematic diagram of the connection structure between the upper rotating arm and the sliding member of the third embodiment.

As shown in FIG. 9, it is the third embodiment of the connection structure between the upper rotating arm and the sliding member of the present invention.

In this embodiment, the sliding member 41b includes a fixing member 412b and a movable member 413b. The magnetic member 60b is installed on the movable member 413b. The pushing structure 24b includes a rack 246 and a gear 245 engaged with each other. The gear 245 is rotatably connected to the upper rotating arm 22b, and the rack 246 is mounted on the movable member 413. When the rotating stick 21 pushes the upper rotating arm 22b to swing, the upper rotating arm 22b drives the gear 245 to rotate to enable the rack 246 to translate left and right, and the magnetic member 60b translates synchronously with the movable member 413b.

The disclosure also provides a handle including the joystick device described in the above embodiment. Adopting the structure of the joystick device, the handle has the advantages of high control accuracy, high sensitivity, stable output signal, long service life and the like.

The handle mentioned in this disclosure is mainly a VR game handle, which can completely solve the problem of "drift" during the game of game players. Of course, in addition, the joystick device can also be used in products such as drone remote controls, automatic wipers, or automatic rearview mirrors.

The above embodiments are only a description of the preferred embodiments of the present invention, and do not limit the scope of the present invention. Without departing from the design spirit of the present invention, various modifications and changes made by ordinary skill person in the art to the technical solutions of the present invention should fall within the protection scope determined by claims of the present invention.

The invention claimed is:

1. A joystick device, comprising:
 a housing;
 a joystick assembly, mounted to the housing, the joystick assembly being capable of swinging in a first direction and a second direction perpendicular to each other;
 a reset assembly mounted in the housing, being configured to reset the joystick assembly after the joystick assembly swings;
 a translation assembly, mounted in the housing, and translating to left-right or forward-backward according to swing of the joystick assembly in the first direction or swing of the joystick assembly in the second direction respectively, a magnetic element fixed on the translation assembly;
 a circuit board, mounted in the housing and a magnetic induction element fixed on the circuit board, the magnetic induction element generating an output that changes with the movement of the translation assembly, wherein the joystick assembly comprises: an upper rotating arm; a lower rotating arm being orthogonal to the upper rotating arm; and a rotating stick, passed through the upper rotating arm and the lower rotating arm in sequence, and connected to the lower rotating arm; the rotating stick pushing the upper rotating arm to swing in the first direction, and pushing the lower rotating arm to swing in the second direction; a snap dome is located on the circuit board to act as a switch button; a pressing block is located on the lower rotating arm and extends downward from the fourth shaft end, and the pressing block is hung above the snap dome.

2. The joystick device of claim 1, wherein the upper rotating arm is arched shaped, a first protrusion protrudes upwardly from a center position of the upper rotating arm, a first shaft end and a second shaft end are located on both sides of the first protrusion; a center position of the first protrusion defines a through hole; a second protrusion protrudes downward from a center position of the lower rotating arm, a third shaft end and a fourth shaft end are located on both sides of the second protrusion; a concave is defined in a center position of a upper surface of the second protrusion; an lower end of the rotating stick is passed through the through hole of the upper rotating arm and then engaged with a groove of the lower rotating arm.

3. The joystick device of claim 1, wherein the housing comprises:
 a base;
 a bottom cover, an upper surface of the base defines an opening, and the base being engaged with the bottom cover to form a central cavity in that the joystick assembly, the reset assembly, the translation assembly and the circuit board are located, and an upper end of the rotating stick extends out of the base from the opening.

4. The joystick device of claim 3, wherein the translation assembly comprises two sets of sliding members, each set of the sliding members are equipped with the magnetic element; two sliding grooves are defined inside of the base, the two sets of the sliding members are installed in the sliding grooves correspondingly, and each set of the sliding members slide in the corresponding sliding groove.

5. The joystick device of claim 4, wherein the reset assembly comprises a spring, an center position of the circuit board defines an embedded hole, and a lower end of the spring is embedded in the embedded hole, an upper end of the spring abuts against the second protrusion of the lower rotating arm.

6. The joystick device of claim 5, wherein the reset assembly further comprises a gasket, and the gasket is arranged between the spring and the lower rotating arm.

7. The joystick device of claim 6, wherein the first shaft end of the upper rotating arm and the third shaft end of the lower rotating arm both have a pushing structure, and the pushing structure pushes the sliding member to translate.

8. The joystick device of claim 7, wherein the pushing structure having a clamping block, the sliding member defines a clamping slot, and the clamping block is clamped in the clamping slot; when the rotating stick pushes the upper rotating arm or the lower rotating arm to swing, the sliding member is pushed to translate.

9. A handle, comprising:
a housing;
a joystick assembly, mounted to the housing, the joystick assembly being capable of swinging in a first direction and a second direction perpendicular to each other;
a reset assembly mounted in the housing, being configured to reset the joystick assembly after the joystick assembly swings;
a translation assembly, mounted in the housing, and translating to left-right or forward-backward according to swing of the joystick assembly in the first direction or swing of the joystick assembly in the second direction respectively, a magnetic element fixed on the translation assembly;
a circuit board, mounted in the housing and a magnetic induction element fixed on the circuit board, the magnetic induction element generating an output that changes with the movement of the translation assembly; wherein the joystick assembly comprises: an upper rotating arm; a lower rotating arm, being orthogonal to the upper rotating arm; and a rotating stick, passed through the upper rotating arm and the lower rotating arm in sequence, and connected to the lower rotating arm; the rotating stick pushing the upper rotating arm to swing in a first direction, and pushing the lower rotating arm to swing in a second direction; a snap dome is located on the circuit board to act as a switch button; a pressing block is located on the lower rotating stick and extends downward from the fourth shaft end, and the pressing block is hung above the snap dome.

10. The handle of claim 9, wherein the upper rotating arm is arched shaped, a first protrusion protrudes upwardly from a center position of the upper rotating arm, a first shaft end and a second shaft end are located on both sides of the first protrusion; a center position of the first protrusion defines a through hole; a second protrusion protrudes downward from a center position of the lower rotating arm, a third shaft end and a fourth shaft end are located on both sides of the second protrusion; a concave is defined in a center position of an upper surface of the second protrusion; a lower end of the rotating stick is passed through the through hole of the upper rotating arm and then engaged with a groove of the lower rotating arm.

11. The handle of claim 9, wherein the housing comprises a base and a bottom cover, an upper surface of the base defines an opening, and the base is engaged with the bottom cover to form a central cavity, the joystick assembly, the reset assembly, the translation assembly and the circuit board are located in the central cavity, and the upper end of the rotating stick extends out of the base from the opening.

12. The handle of claim 11, wherein the translation assembly comprises two sets of sliding members, each set of the sliding members are equipped with the magnetic element; two sliding grooves are defined inside of the base, the two sets of the sliding members are installed in the sliding grooves correspondingly, and each set of the sliding members slide in the corresponding sliding groove.

13. The handle of claim 12, wherein the reset assembly comprises a spring, an center position of the circuit board defines an embedded hole, and a lower end of the spring is embedded in the embedded hole, an upper end of the spring abuts against the second protrusion of the lower rotating arm.

* * * * *